United States Patent
Yen et al.

(10) Patent No.: US 8,901,714 B2
(45) Date of Patent: Dec. 2, 2014

(54) TRANSMISSION LINE FORMED ADJACENT SEAL RING

(71) Applicant: Taiwan Semiconductor Manufacturing Co., Ltd., Hsin-Chu (TW)

(72) Inventors: Hsiao-Tsung Yen, Tainan (TW);
Yu-Ling Lin, Beitou District Taipei (TW); Cheng-Wei Luo, Hsinchu (TW);
Chin-Wei Kuo, Zhubei (TW);
Chewn-Pu Jou, Hsinchu (TW);
Min-Chie Jeng, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/916,802

(22) Filed: Jun. 13, 2013

(65) Prior Publication Data
US 2014/0264745 A1    Sep. 18, 2014

Related U.S. Application Data

(60) Provisional application No. 61/781,363, filed on Mar. 14, 2013.

(51) Int. Cl.
*H01L 23/02* (2006.01)
*H01L 23/544* (2006.01)
*H01L 29/93* (2006.01)

(52) U.S. Cl.
CPC ...................................... *H01L 29/93* (2013.01)
USPC .............. 257/620; 257/532; 257/48; 257/409

(58) Field of Classification Search
CPC ... H01L 21/00; H01L 2223/6638; H01P 1/00; H01P 1/022; H01P 1/042; H01P 1/122
USPC ............................ 257/396, 532, 48, 620, 409
See application file for complete search history.

(56) References Cited

U.S. PATENT DOCUMENTS

| | | | |
|---|---|---|---|
| 5,023,574 A | 6/1991 | Anklam et al. | |
| 5,136,364 A | 8/1992 | Byrne | |
| 5,578,860 A * | 11/1996 | Costa et al. | 257/528 |
| 6,492,716 B1 | 12/2002 | Bothra et al. | |
| 6,967,392 B2 | 11/2005 | Tsai et al. | |
| 7,265,438 B2 | 9/2007 | Tsai et al. | |
| 7,274,262 B2 | 9/2007 | Ham et al. | |
| 7,538,603 B2 * | 5/2009 | Ikeda et al. | 327/565 |
| 8,125,052 B2 | 2/2012 | Jeng et al. | |

(Continued)

OTHER PUBLICATIONS

Shih-Hung Chen, et al.; "Investigation on Seal-Ring Rules for IC Product Reliability in 0.25-um CMOS Technology": Microelectronics Reliability; www.sciencedirect.com; 45; 2005; p. 1311-1316.

(Continued)

*Primary Examiner* — Zandra Smith
*Assistant Examiner* — Damian A Hillman
(74) *Attorney, Agent, or Firm* — Eschweiler & Associates, LLC

(57) ABSTRACT

An integrated circuit device includes a semiconductor body, active components formed over the semiconductor body, one or more seal rings surrounding the active components, and a signal line. One or more of the seal rings are configured to provide the primary return path for current flowing through the signal line.

20 Claims, 3 Drawing Sheets

(56) References Cited

U.S. PATENT DOCUMENTS

| | | | |
|---|---|---|---|
| 8,212,323 B2 * | 7/2012 | Lee et al. | 257/409 |
| 8,253,217 B2 | 8/2012 | Chen et al. | |
| 8,273,616 B2 | 9/2012 | Chen et al. | |
| 8,283,754 B2 | 10/2012 | Lin et al. | |
| 8,338,917 B2 | 12/2012 | Yaung et al. | |
| 2006/0226510 A1 * | 10/2006 | Goren et al. | 257/531 |
| 2008/0252348 A1 * | 10/2008 | Hannah et al. | 327/170 |
| 2009/0160583 A1 * | 6/2009 | Zhou et al. | 333/247 |
| 2012/0133446 A1 | 5/2012 | Lin et al. | |
| 2012/0153433 A1 | 6/2012 | Yen et al. | |
| 2012/0267626 A1 | 10/2012 | Cho et al. | |
| 2012/0268229 A1 | 10/2012 | Yen et al. | |

OTHER PUBLICATIONS

Chapter 4: The Wire; Sep. 6, 1999, p. 1-41.

* cited by examiner

TRANSMISSION LINE FORMED ADJACENT SEAL RING

REFERENCE TO RELATED APPLICATION

This application is a Non-Provisional patent application claiming priority to Provisional patent application Ser. No. 61/781,363 filed on Mar. 14, 2013 in the name of Hsiao-Tsung Yen, et al., entitled "Transmission Line Formed Adjacent Seal Ring" and is hereby incorporated by reference.

FIELD

The present disclosure relates to integrated circuit devices that include transmission lines and methods of making and operating such devices.

BACKGROUND

Transmission lines provide guided transmission of power or information. Because power flows in loops, a transmission line requires two conductors. Two types of transmission lines commonly used within integrated circuits are microstrip transmission lines and coplanar waveguides. A microstrip transmission line includes a signal line, which is a conductive metal strip, and a planar ground separated from the signal line by dielectric. A coplanar waveguide includes a signal line flanked by two return lines. The return lines provide a return path for current flowing through the signal line.

The coplanar waveguide has more tunable parameter than the microstrip transmission line and can generally provide superior performance for that reason. Integration and process limitations constrain parameters other than lateral dimensions. With a microstrip transmission line, the width of the signal line can be varied but the thickness of the signal line and the dielectric are largely constrained. With a coplanar wave guide, the widths of the return lines and their spacing from the signal line are additional parameters that can be varied to achieve desired transmission line characteristics. The main disadvantage of the coplanar waveguide in comparison to the microstrip transmission line is that the coplanar waveguide requires a much greater amount of chip area.

DETAILED DESCRIPTION

The present disclosure provides semiconductor devices in which a transmission line is formed by one or more seal rings and a signal line. The seal rings provides a return path for current flowing through the signal line. The signal line can be formed within or without the space surrounded by the seal rings. Using the seal rings to provide a return path for a transmission line reduces the amount of chip area required.

The seal rings and the signal line are driven to a voltage differential at one end of the transmission line. The voltage differential generally varies with time. At the other end of the transmission line, the seal rings and the signal line are coupled through a load. In some embodiments, the load is approximately equal to the characteristic impedance of the signal line. In some embodiments, the transmission line is used for "single-ended" signals, meaning that the signal line carries signals that are referenced to a ground potential.

Figure 1:
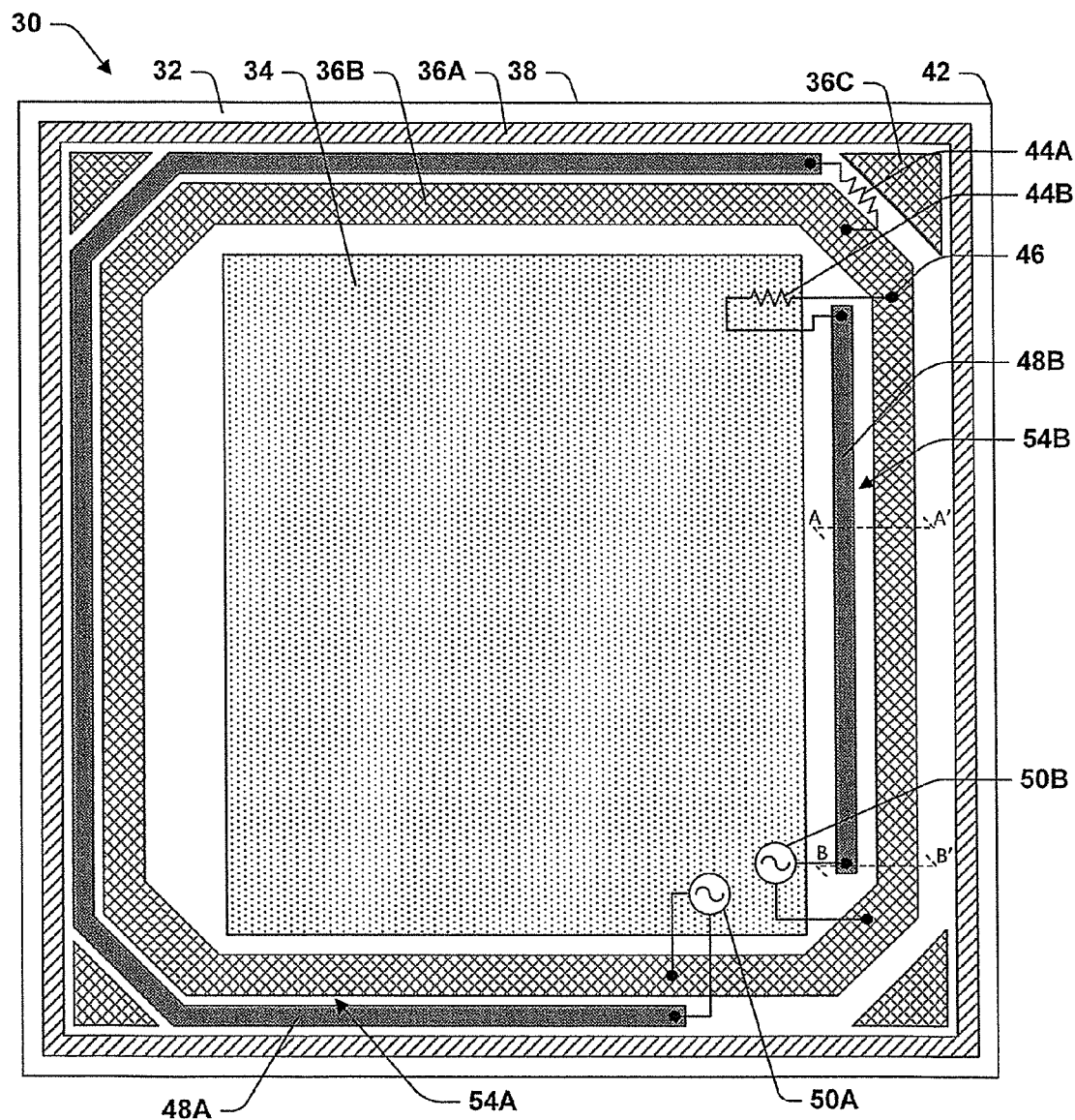
FIG. 1 is a plan view of an example semiconductor including transmission lines provided by the present disclosure.

FIG. 1 illustrates an integrated circuit device 30 that includes two examples of transmission lines according to the present disclosure. The device 30 includes a semiconductor body 32 over which are formed various structures including integrated circuits within an active area 34. Seal rings 36A and 36B (collectively "seal rings 36") surround the active area 34. Seal ring 36A runs parallel to and adjacent to the perimeter 38 of the device 30. Prior to dicing, seal ring 36A runs parallel and adjacent score or scribe lines (not shown) separating elements in an array of devices 30. Seal ring 36B is concentrically located with respect to seal ring 36A. Additional seal ring structures 36C are located proximate the corners 42 of the device 30.

Although not required, in some embodiments signal lines 48B and 48A are configured parallel to and adjacent lengths of one or more of the seal rings 36. In some embodiments, the signal line 48 are the seal ring 36 of a transmission line 54 are separated by a distance in the range from about 2 µm to about 30 µm. Signal line 48B is located within the seal rings 36. An advantage of this configuration is that the signal line 48B is protected by the seal rings 36 to the same extent as devices within the active area 34. Signal line 48A is located outside of seal ring 36B, but within seal ring 36A. An advantage of this configuration is that the seal ring 36B shields the active area 34 from noise generated by signal line 48A.

Signal line 48B and seal ring 36B form transmission line 54B. Transmission line 54B has contacts 46. At one end of transmission line 54B, contacts 46 are bridged by resistance 44B. At the opposite end, contacts 46 are bridged by driver 50B. Signal line 48A and seal ring 36A are conductors of transmission line 54A. These conductors are bridged at one end by resistance 44A and by driver 50A at the other end.

Seal rings 36 are structures formed proximate the perimeter of an integrated circuit device and can provide one or more functions. A primary function is usually protecting devices in the active area 34 from damage during sawing. To better serve that purpose, the device 30 may include two or more concentric seal rings 36. Another usual function is to protect devices in the active area 34 from moisture. To serve this purpose integrated circuit devices typically include at least one seal ring 36 that forms a continuous, or nearly continuous, band of metal extending from the surface of semiconductor 32 to an overlying encapsulation layer 64. In addition, the outermost seal ring, seal ring 36A in FIG. 1, is generally within 10 µm of edge 38.

Figure 2:
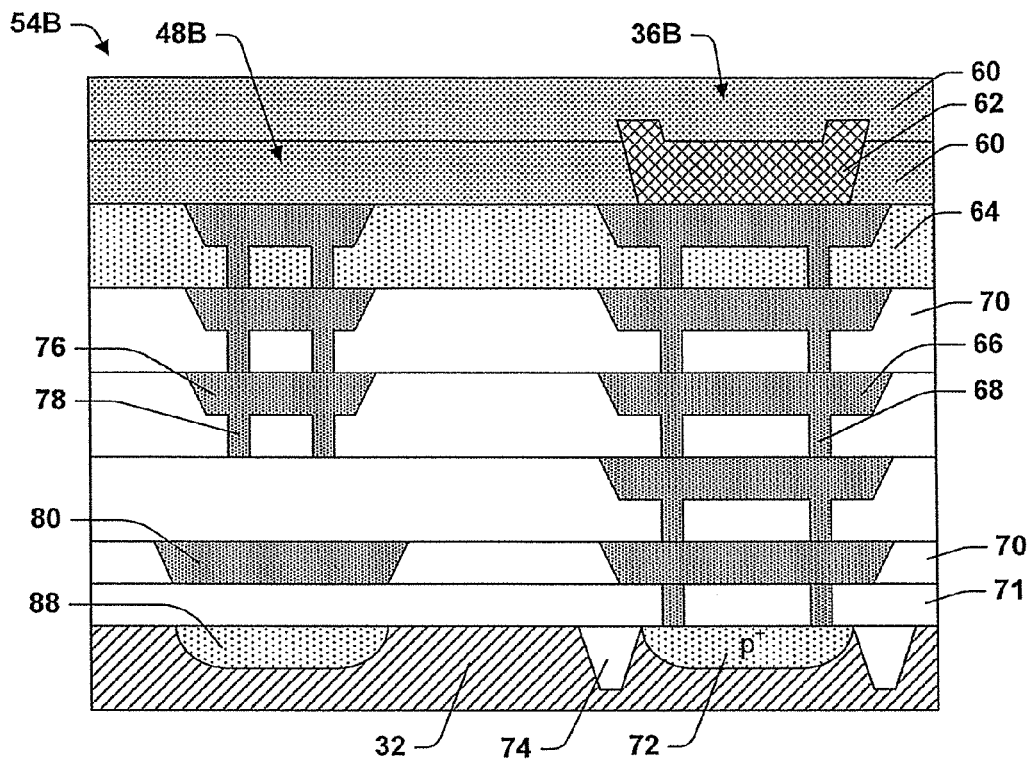
FIG. 2 is a cross-section of an example transmission line taken along the line A-A' shown in FIG. 1.

FIG. 2 illustrates a cross-section of transmission line 54B taken along the line A-A' of FIG. 1 and provides example structures for the seal rings 36 and the signal lines 48. Seal ring 36B can be formed by a plurality of metal strips 66 interconnected by metal vias 68 in dielectric layers 70. Metal strips 66 can have any suitable width. In some embodiments, the width of a seal ring 36 forming part of a transmission line 54 is in the range from about 2 µm to about 60 µm. In some of these embodiments, the width of a seal ring 36 is in the range from 5 to 15 µm.

Seal rings 36 can be grounded to the semiconductor body 32. Heavily doped areas 72 within the semiconductor body 32 provide contacts for grounding seal ring 36B to the semiconductor body 32. Heavily doped areas 72 are bounded by shallow trench isolation regions 74 and the areas 72 can be silicided to reduce contact resistance.

For at least one of the seal rings 36, vias 68 are continuous, or nearly continuous along the length of the seal ring, whereby the vias 68 form bars and the seal ring 36 forms a continuous band of metal. In some embodiments, the continuity of one or more of the seal rings 36 is interrupted by narrow gaps to limit propagation of signals. Any such breaks are formed outside the circuit of transmission lines 54.

The lowermost dielectric layer 71 can be any suitable dielectric, but is typically a dielectric such as borosilicate glass. An upper dielectric layer 64 can function as an encapsulation layer. An encapsulation layer can provide a moisture barrier. Suitable materials for an encapsulation layer include silicate glasses. Seal ring 36B further includes an optional aluminum cap 62. Upper most dielectric layers 60 are passivation layers. Suitable materials for passivation layers 60 include, without limitation SiN, SiON, and polyimides.

The dielectric layers 70 can be formed from any suitable dielectric. In some embodiments, dielectric layers 70 are layers of low-k dielectrics. A low-k dielectric is a material having a dielectric constant significantly lower than that of silicon dioxide. Examples of low-k dielectrics include porous glasses and polyimide nanofoams. Porous glasses include organosilicate glasses (OSGs). The low-k dielectric can be organic or inorganic. Examples organic low-k dielectrics include benzocyclobutene, parylene, polyarylene ethers, and fluorocarbons. Examples of inorganic low-k dielectrics include porous silica, fluorinated amorphous carbon, methyl silsesquioxane, hydrogen silsesquioxane, and fluorinated silicon dioxide.

The metal strips 66 and the metal vias 68 can be formed of any suitable metal. In some embodiments, the metal is copper or copper alloy. The metal lines and vias can be formed by any suitable process, including damascene and dual damascene processes.

The resistances 44 can be simple resistors or more complex devices providing the desired resistance. In some embodiments, the resistance 44 is matched to the characteristic impedance of the signal line 48. In some embodiments, the impedance is in the range from 10 to 200 ohms. Typically, the characteristic impedance is approximately 50 ohms. The resistance is generally within plus or minus 50% of the characteristic impedance.

The driver 50 can be any device that produces a voltage differential between the contacts 46 at one end of the transmission line 54. The driver 50 is typically an oscillator. In some embodiments, the driver 50 is low-phase-noise signal source. In some embodiments, the low-phase-noise signal source is a tunable oscillator. Examples of tunable oscillators include quadrature voltage controlled oscillators and other voltage-controlled oscillators. Additional examples of low-phase-noise signal sources include, without limitation, resonators and phase-lock-loop (PLL) synthesizers. Examples of resonators include high-Q ceramic-resonators, dielectric-resonators (DR), yttrium-iron-garnet (YIG) resonators, and surface-acoustic-wave (SAW) resonator oscillators.

The resistors 44 can be located within the active area 34 as is the resistor 44B. In some embodiments, a resistor 44 is located outside of one or more of the seal rings 36 as is the resistor 44A. The drivers 50 are generally located within the active area 34 but can also be placed outside one or more of the seal rings 36.

Figure 3:
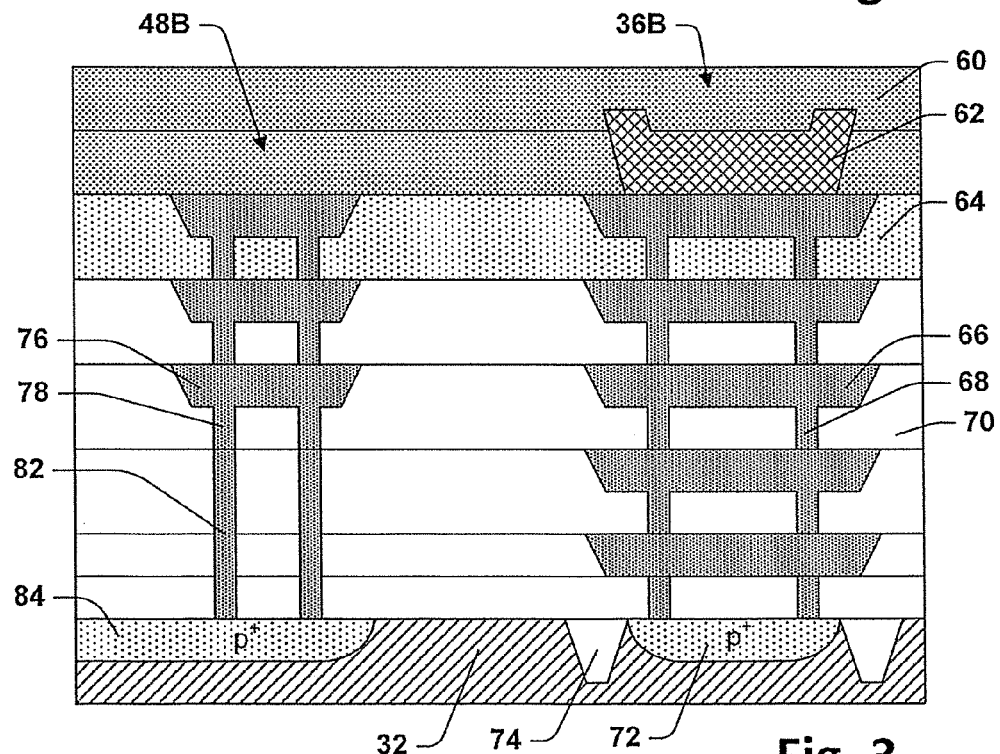
FIG. 3 is a cross-section of an example transmission line taken along the line B-B' shown in FIG. 1.

FIG. 3 illustrates a cross-section of transmission line 54B taken along the line B-B' of FIG. 1 and illustrates a way in which contacts 46 can be coupled to drivers 50 or resistors 44. Vias 82 form a contact 46 coupling signal line 48B to buried contact line 84. Buried contact line 84 is formed by a doped area of the substrate 32 and connects to driver 50B in active area 34. An advantage of forming connecting lines between contacts 46 and drivers 50 or resistors 44 using buried contact lines is that buried contacts lines can run beneath seal rings 36 without affecting the seal ring structures. Contact lines can also be formed by polysilicon lines or metal interconnects.

Drivers 50 can be coupled to signal lines 48 through gates (not shown). Gates can be to selectively couple a transmission 54 to a source 50. In some embodiments, two or more gates are used to selectively couple any one of two or more drivers 50 to a signal line 48. Drivers 50 are generally referenced to ground. The connection to ground can be through the seal ring 36 or a connection to a ground to which the seal ring 36 is also connected. Transmission lines 54 are generally single-coupled.

As illustrated by FIG. 2, signal lines 48 can share some structural elements with seal rings 36. Signal line 48B includes a plurality of metal strips 76 interconnected by vias 78. Vias 78 are optionally replaced by continuous metal strips, whereby signal line 48B can be a single strip of metal spanning several of the dielectric layers 70. In some embodiments, a signal line 48 has a width from about 2 µm to about 30 µm. In general, it is desirable to optimize the cross-sectional area of a signal line 48 in order to provide a desired resistance per unit length. In some embodiments, a signal line 48 has a cross-sectional area from about 15 µm$^2$ to about 1000 µm$^2$. A desired cross-sectional area can be achieved by suitably selecting one or more of the width of signal line 48, the number of layers 70 spanned by the signal line 48, and the density of the vias 78. In general, a signal line 48 will occupy fewer layers of the dielectric 70 as compared to the seal rings 36.

The signal line 48 is above the surface of the semiconductor body 32. In some embodiments, the signal line 48 is separated from the semiconductor body 32 by a distance from about 2 µm to about 10 µm. Some separation is desirable to isolate the signal line 48 from the semiconductor body 32. On the other hand, a certain amount of capacitive coupling between the semiconductor body 32 and the signal line 48 can be useful for achieving a desired impedance. In some embodiments, an area of the semiconductor body 32 is doped in an area 88 that is beneath the signal 48 in order to increase capacitive coupling between the semiconductor body 32 and the signal line 48. On the other hand, in some other embodiments, the semiconductor body 32 does not have a separately doped area 88 beneath the signal line 48.

FIG. 2 illustrates a ground shield 80 that is not required but is provided in some embodiments. The ground shield 80 is positioned between the signal line 48B and the semiconductor body 32. Ground shield 80 mitigates coupling between the signal line 48B and the semiconductor body 32 and reduces associated power losses. In some embodiments, the ground shield 80 is grounded to semiconductor body 32. In some embodiments, the ground shield 80 is grounded to a seal ring 36.

For some applications, the length of the transmission line 54 is an important design parameter. In some embodiments, a transmission line 54 has a short length in the range from about 5 µm to about 50 µm. In some other embodiments, a transmission line 54 has a length in the range from about 500 µm to about 4000 µm. Achieving a desired length within the available chip area can be challenging. In some embodiments, the required length for the transmission line 54 is reduced by introducing a slow wave transmission mode.

There are several options for creating a slow wave effect in the transmission line 54. In some embodiments, a ground shield 80 is a slotted ground. In some embodiments, the vias 68 in seal ring 36B are made periodic with respect to distance along transmission line 54, whereby seal ring 36B acts as a slotted ground. In some embodiments, the vias 78 in signal line 48B are made periodic with respect to distance along transmission line 54, which is another way of introducing a slow wave effect.

It can be difficult to match the characteristic impedance of a signal line 54 to a desired value. Impedance matching can be facilitated by introducing floating nodes 90, which are ungrounded conductive elements, into the dielectric 70 around signal line 48. For example, floating nodes 90 can be placed periodically along the length of the signal line 48B in the same position in which the optional ground shield 80 is positioned in FIG. 2. In some embodiments, the floating nodes 90 are from about 1 μm to about 10 μm below the signal line 48. In some embodiments, floating nodes 90 have widths and length within the range from about 0.05 μm to about 20 μm.

In some embodiments, the capacitance introduced by floating nodes 90 is increased by doping the semiconductor body 32 within areas 88 that are below floating nodes 90. In some embodiments, the capacitance is controlled by applying a bias voltage to the areas 88. In these embodiments, the areas 88 are doped to an opposite doping type from the bulk of the semiconductor body 32. In these embodiments, the floating nodes 90 and the doped areas 88 can form on or more varactors arrayed along the length of the transmission line 54 and controlling its RLC characteristics.

In some embodiments, structures in the place of floating nodes 90 are coupled to the signal line 48. In these embodiments, the structures 90 are no longer floating nodes, but are extensions of the signal line 48. Such extensions increase capacitive coupling with of the semiconductor body 32. In some embodiments, this coupling is increased by doping within areas 88 of the semiconductor body 32 below the signal line 48. In some of these embodiments, the doped areas 88 are voltage controlled to vary capacitance and control the RLC characteristics of signal line 48.

Figure 4:
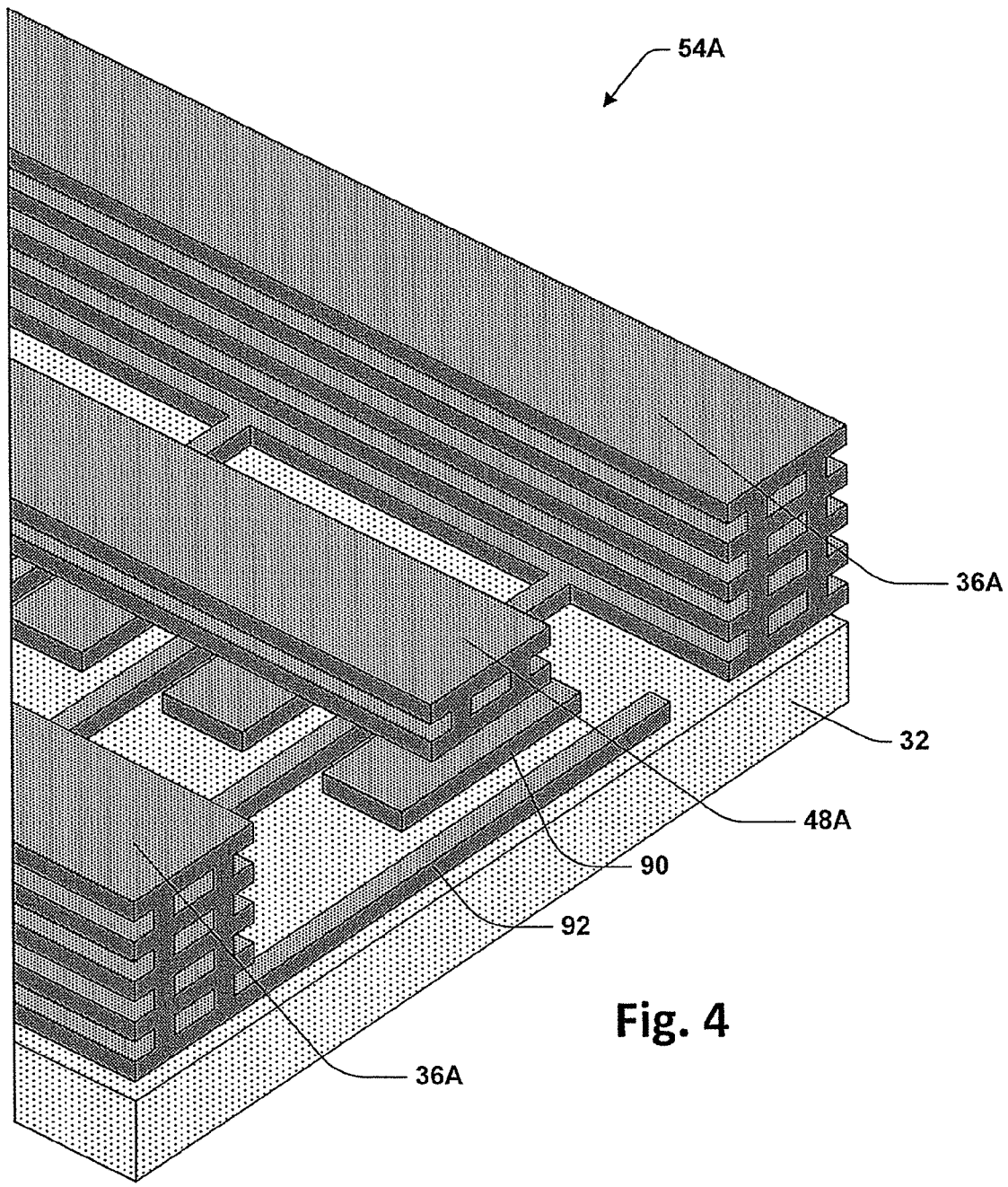
FIG. 4 is a perspective cut-away view of an example transmission line.

FIG. 4 provides an example of a transmission line 54A including both a slotted ground shield 80 and floating nodes 90. Slotted grounded 90 is formed by slot extension 92, which are extensions of seal rings 36 protruding into the dielectric 70 between the signal line 48A, and the underlying semiconductor body 32. Floating nodes 90 are above the level of slot extensions 92 and capacitively couple with the signal line 48A.

Slot extensions 92 can couple to ground through seal ring 36A. In some embodiments, slot extensions 92 couple directly to ground. In some of these embodiments, direct coupling is provided by vias (not shown) that rise from semiconductor body 32 to contact slot extensions 92. In some others of these embodiments, slot extensions 92 are in direct contact with semiconductor body 32. In some embodiments, the semiconductor body 32 is doped beneath slot extensions 92 to improve direct coupling between slot extensions 92 and ground. In some embodiments, the width of slot extensions 92 is in the range from about 0.05 μm to about 5 μm.

The semiconductor body 32 includes a semiconductor. The semiconductor can be in crystal or polycrystalline form. The semiconductor can be an elementary semiconductor such as silicon or germanium, or a compound semiconductor such as SiGe, GaAs, or InP. The semiconductor composition can vary with location as in a continuously varying ratio of Si to Ge in a SiGe semiconductor. The semiconductor can have a multi-layer structure. The semiconductor can be lightly doped.

The present disclosure describes integrated circuit devices including a semiconductor body 32 a seal ring 36 formed over the semiconductor body 32, and a transmission line 54 in which the seal ring 36 forms part of the transmission line 54. The structure of these devices can reduce the chip area required for transmission lines by utilizing seal ring 36 as part of the transmission line structure. While the transmission line structures described by this disclosure were developed with the idea of incorporating seal ring 36, these same transmission line structures can be used independently from any seal ring. Accordingly, alternative embodiments are formed by replacing seal ring 36 with a conductive structure in similar geometric relationship to the signal line 48.

The present disclosure provides an integrated circuit device including a semiconductor body, active components formed over the semiconductor body, one or more seal rings surrounding the active components, and a signal line. One or more of the seal rings are configured to provide the primary return path for current flowing through the signal line.

The present disclosure provides an integrated circuit device including a semiconductor body a seal ring formed over the semiconductor body, a signal line formed over the semiconductor body, and a transmission line comprising the seal ring and the signal line.

The present disclosure provides a method of forming an integrated circuit device the includes providing a semiconductor body, forming active components over the semiconductor body, forming one or more seal rings functional to protect the active components from moisture, forming a signal line over the semiconductor body, and configuring the one or more seal ring to provides the primary return path for current flowing through the signal line.

The present disclosure provides an integrated circuit device that includes a semiconductor body and a transmission line formed over the semiconductor body. The transmission line includes a signal line and has termini. A plurality of varactors are formed beneath the signal line between the termini of the transmission line.

The disclosure as delineated by the following claims has been shown and/or described in terms of certain concepts, components, and features. While a particular component or feature may have been disclosed herein with respect to only one of several concepts or examples or in both broad and narrow terms, the components or features in their broad or narrow conceptions may be combined with one or more other components or features in their broad or narrow conceptions wherein such a combination would be recognized as logical by one of ordinary skill in the art. Also, this one specification may describe more than one embodiment and the following claims do not necessarily encompass every concept, aspect, embodiment, or example described herein.

The invention claimed is:

1. An integrated circuit device, comprising:
   a semiconductor body;
   active components formed over the semiconductor body;
   one or more seal rings surrounding the active components; and
   a transmission line comprising the one or more seal rings and a signal line formed over the semiconductor body;
   wherein the one or more seal rings provide the primary return path for current flowing through the signal line.

2. The integrated circuit device of claim 1, wherein the transmission line is terminated at one end with a resistance approximately equal to the characteristic impedance of the transmission line.

3. The integrated circuit device of claim 1, wherein the signal line voltage is driven at one end thereof by a tunable oscillator.

4. The integrated circuit device of claim 3, wherein the oscillator is grounded to the seal ring or shares a common ground with the seal ring.

5. The integrated circuit device of claim 2, wherein the transmission line runs parallel and adjacent to a length of a seal ring.

6. The integrated circuit device of claim 1, further comprising a ground shield positioned between the signal line and the semiconductor body.

7. The integrated circuit device of claim 6, wherein the ground shield is a slotted ground.

8. The integrated circuit device of claim 1, wherein the one or more seal rings each comprise multiple layers of vertically aligned conductive metal strips interconnected by conductive vias.

9. The integrated circuit device of claim 8, wherein the one or more seal rings are configured to induce a slow wave effect in the signal line.

10. The integrated circuit device of claim 8, wherein the signal line comprises multiple layers of vertically aligned conductive metal strips interconnected by conductive vias.

11. The integrated circuit of claim 10, wherein the signal line has fewer layers of conductive metal strips than the seal ring.

12. The integrated circuit of claim 10, wherein the conductive vias of the one or more seal rings or the signal line are periodically spaced along the length of the signal line.

13. The integrated circuit device of claim 1, further comprising a plurality of floating conductive elements positioned between the signal line and the semiconductor body, the conductive elements being periodically spaced along the signal line.

14. The integrated circuit device of claim 1, wherein the seal ring comprises a plurality of slot extensions that are periodically spaced along the length of the signal line and protrude into the space between the signal line and the semiconductor body.

15. The integrated circuit device of claim 1, wherein one or more varactors are formed beneath the signal line between termini of the transmission line.

16. The integrated circuit device of claim 1, wherein the seal ring surrounds the active components but not the signal line.

17. An integrated circuit device, comprising:
a semiconductor body; and
a seal ring formed over the semiconductor body;
a signal line formed over the semiconductor body; and
a transmission line comprising the seal ring and the signal line.

18. The integrated circuit device of claim 17, further comprising periodic shunt loading configured to induce a slow wave effect in the signal line.

19. An integrated circuit device, comprising:
a semiconductor body;
a transmission line having termini and comprising one or more seal rings and a signal line formed over the semiconductor body; and
a plurality of varactors formed beneath the signal line between termini of the transmission line.

20. The integrated circuit device of claim 19, further comprising:
active components formed over the semiconductor body;
wherein the one or more seal rings are functional to protect the active components from moisture.

* * * * *